(12) United States Patent
Choi

(10) Patent No.: US 11,646,089 B2
(45) Date of Patent: May 9, 2023

(54) MEMORY DEVICE FOR PERFORMING VERIFY OPERATION AND OPERATING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/396,552

(22) Filed: Aug. 6, 2021

(65) Prior Publication Data

US 2022/0270696 A1    Aug. 25, 2022

(30) Foreign Application Priority Data

Feb. 22, 2021    (KR) ........................ 10-2021-0023654

(51) Int. Cl.

| G11C 16/04 | (2006.01) |
|---|---|
| G11C 16/34 | (2006.01) |
| G11C 16/24 | (2006.01) |
| G11C 16/10 | (2006.01) |
| G11C 11/56 | (2006.01) |

(52) U.S. Cl.
CPC .......... *G11C 16/3459* (2013.01); *G11C 16/10* (2013.01); *G11C 16/24* (2013.01); *G11C 11/56* (2013.01); *G11C 16/0483* (2013.01)

(58) Field of Classification Search
CPC ..... G11C 16/3459; G11C 16/10; G11C 16/24; G11C 11/56; G11C 16/0483

USPC .................................................... 365/185.22
See application file for complete search history.

(56) References Cited

U.S. PATENT DOCUMENTS

| 8,411,502 B2 * | 4/2013 | Yoon ................. G11C 16/3459 |
| | | 365/185.23 |
| 2019/0115081 A1 * | 4/2019 | Lee ........................ G11C 16/24 |

FOREIGN PATENT DOCUMENTS

| KR | 10-1314306 B1 | 10/2013 |
| KR | 10-1676816 B1 | 11/2016 |
| KR | 10-1802815 B1 | 12/2017 |

\* cited by examiner

*Primary Examiner* — Tha-O H Bui
(74) *Attorney, Agent, or Firm* — IP & T Group LLP

(57) ABSTRACT

A memory device includes a plurality of memory cells, a peripheral circuit, and a control logic. The peripheral circuit programs the plurality of memory cells to a program state among a plurality of program states. The control logic controls the peripheral circuit to perform a program verify operation for at least one program state among the plurality of program states, counts a bit number having a predetermined logic value by comparing a program verify voltage corresponding to a target program state in the at least one program state in a program verify operation for the target program state with threshold voltages of the plurality of memory cells, and determines a start time of a program verify operation for a program state higher than the target program state among the plurality of program states, based on the bit number having the predetermined logic value.

20 Claims, 15 Drawing Sheets

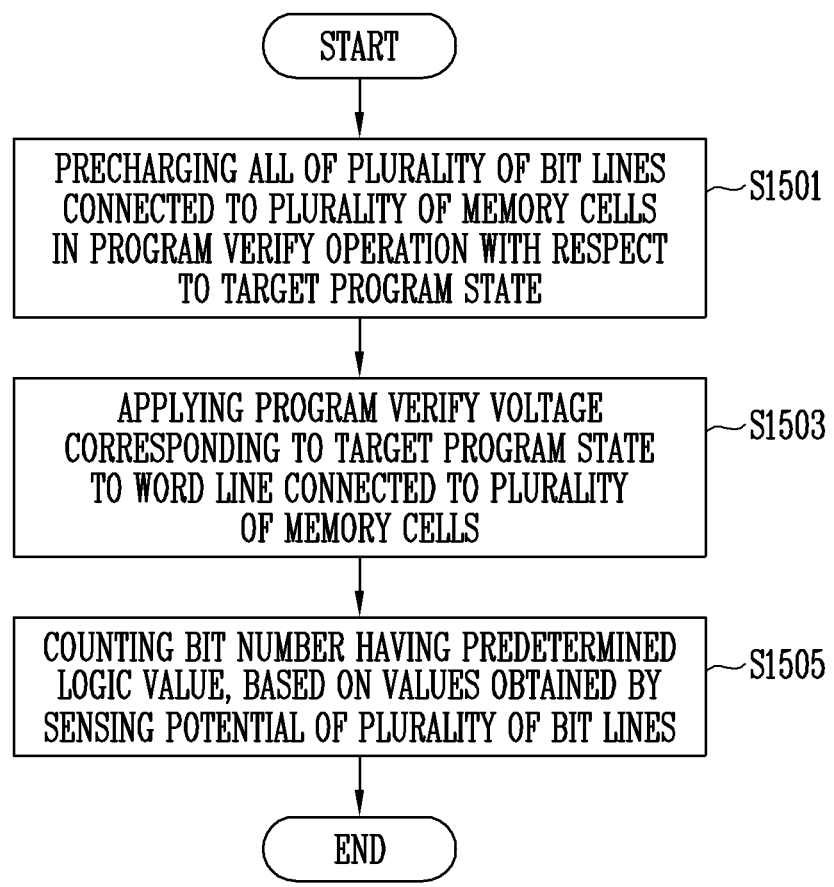

MEMORY DEVICE FOR PERFORMING VERIFY OPERATION AND OPERATING METHOD THEREOF

CROSS-REFERENCE TO RELATED APPLICATION

The present application claims priority under 35 U.S.C. § 119(a) to Korean patent application number 10-2021-0023654 filed on Feb. 22, 2021, the entire disclosure of which is incorporated by reference herein.

BACKGROUND

Field of Invention

The present disclosure generally relates to an electronic device, and more particularly, to a memory device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a memory device having improved program operation performance and an operating method of the memory device.

In accordance with an aspect of the present disclosure, there is provided a memory device including: a plurality of memory cells; a peripheral circuit configured to program the plurality of memory cells to a program state among a plurality of program states; and a control logic configured to control the peripheral circuit to perform a program verify operation for at least one program state among the plurality of program states, count a bit number having a predetermined logic value by comparing a program verify voltage corresponding to a target program state in the at least one program state in a program verify operation for the target program state with threshold voltages of the plurality of memory cells, and determine a start time of a program verify operation for a program state higher than the target program state among the plurality of program states, based on the bit number having the predetermined logic value.

In accordance with another aspect of the present disclosure, there is provided a method for operating a memory device including a plurality of memory cells, the method including: performing a program verify operation for at least one program state among a plurality of program states; counting a bit number having a predetermined logic value by comparing a program verify voltage corresponding to a target program state in the at least one program state in a program verify operation for the target program state with threshold voltages of the plurality of memory cells; and determining a start time of a program verify operation for a program state higher than the target program state among the plurality of program states, based on the bit number having the predetermined logic value.

In accordance with an aspect of the present disclosure, there is provided a memory device including: a plurality of memory cells; a peripheral circuit coupled to the plurality of memory cells; and a control logic coupled to the peripheral circuit and configured to control the peripheral circuit to: program the plurality of memory cells to a target program state among a plurality of program states; perform a program verify operation for the target program state on the plurality of memory cells to verify whether the plurality of memory cells has the target program state; determine a start time of a program verify operation for an adjacent program state to the target program state based on the number of memory cells associated with a pass or fail of the program verify operation for the target program state; and perform a program verify operation for the adjacent program state on the plurality of memory cells at the determined start time.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 15 is a flowchart illustrating a program verify operation of the memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
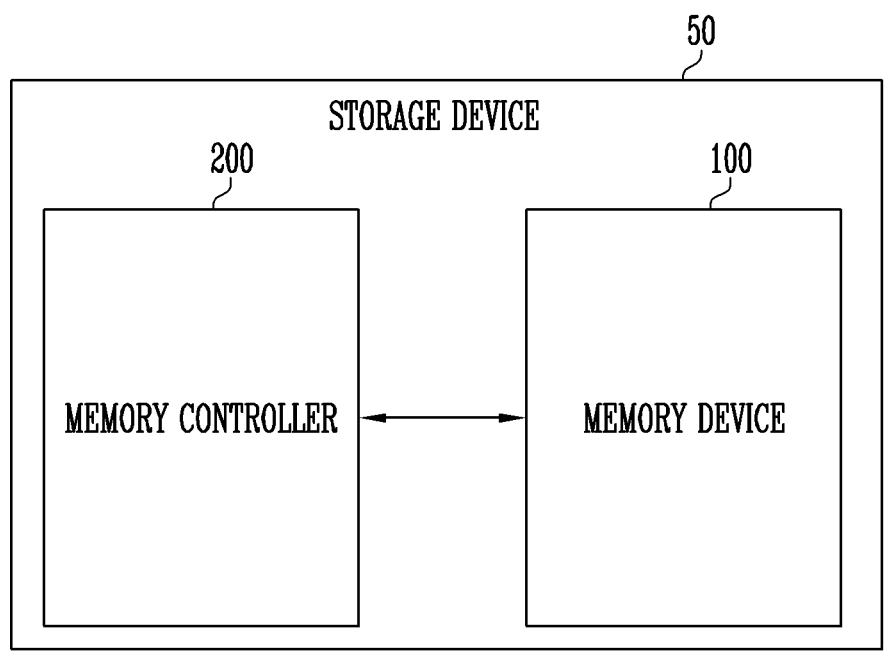
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 configured to control the memory device 100 to perform an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any of various types of storage devices according to a host interface that is at least one of various communication standards or interfaces with the host. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various types of package types. For example, the storage device 50 may be manufactured as any of various types of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example and without any limitation, a case where the memory device 100 is a NAND flash memory is described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme to improve operational performance. The interleaving scheme may be an operating scheme that allows operation periods of at least two memory devices 100 to overlap with each other.

The host may communicate with the storage device 50, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
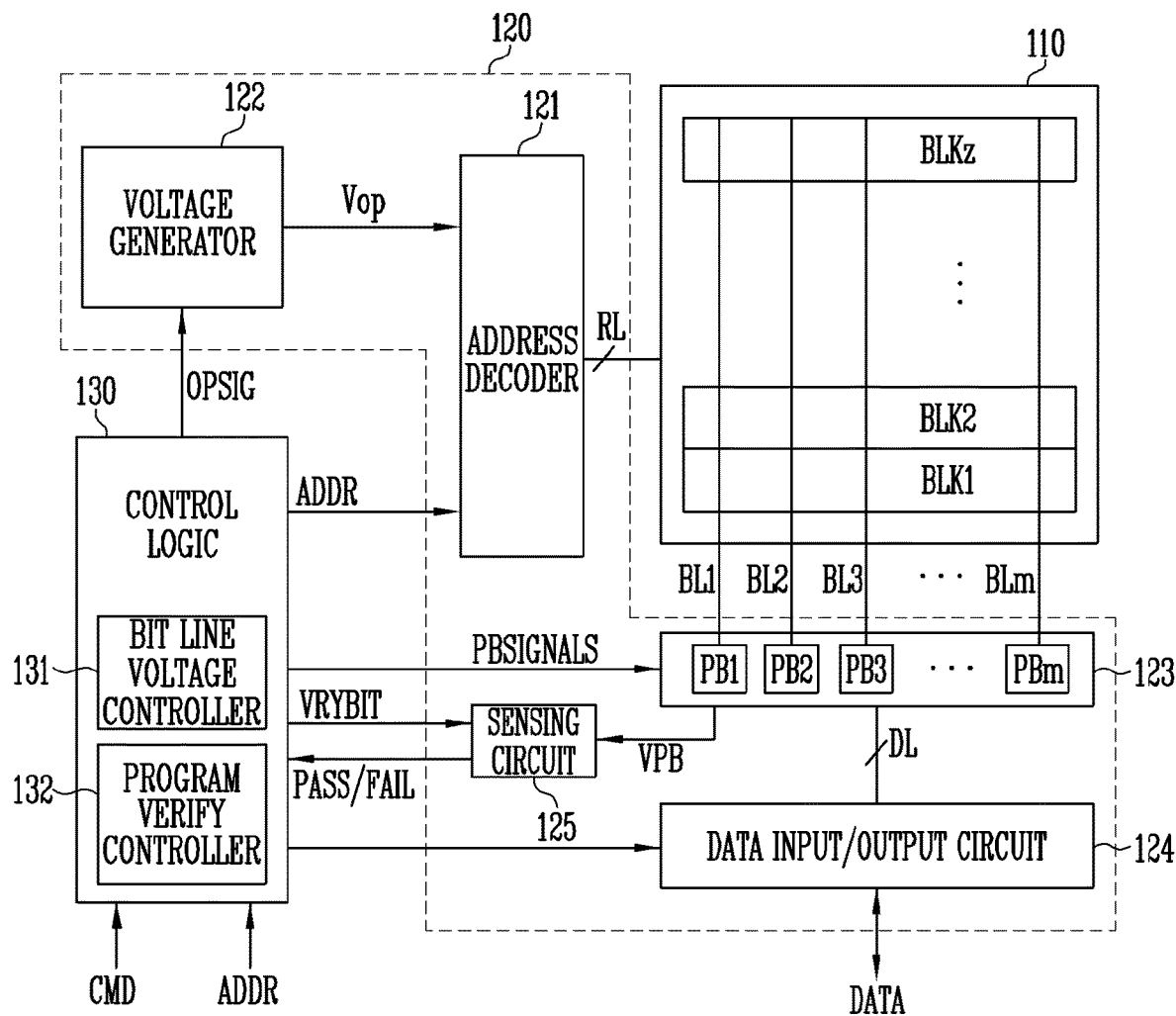
FIG. 2 is a diagram illustrating a structure of a memory device shown in FIG. 1, in accordance with an embodiment of the present disclosure.

FIG. 2 is a diagram illustrating a structure of the memory device 100 shown in FIG. 1, in accordance with an embodiment of the present disclosure.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be connected in series between a drain select transistor and memory cells, and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a selected memory block according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least one memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of operating voltages Vop may be supplied to the memory cell array 110 by the address decoder 121.

The read/write circuit 123 includes first to m-th page buffers PB1 to PBm. The first to m-th page buffers PB1 to PBm are connected to the memory cell array 110 through the respective first to m-th bit lines BL1 to BLm. The first to m-th page buffers PB1 to PBm operate under the control of the control logic 130.

The first to m-th page buffers PB1 to PBm communicate data DATA with the data input/output circuit 124. In a program operation, the first to m-th page buffers PB1 to PBm receive data DATA to be stored through the data input/output circuit 124 and data lines DL.

In a program operation, the first to m-th page buffers PB1 to PBm may transfer, to selected memory cells through the bit lines BL1 to BLm, data DATA received through the data input/output circuit 124 when a program pulse is applied to a selected word line. The selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to m-th page buffers PB1 to PBm read data DATA stored in the selected memory cells through the bit lines BL1 to BLm.

In a read operation, the read/write circuit 123 may read data DATA from memory cells of a selected page through the bit lines BL, and store the read data DATA in the first to m-th page buffers PB1 to PBm.

In an erase operation, the read/write circuit 123 may float the bit lines BL. In an embodiment, the read/write circuit 123 may include a column select circuit.

The data input/output circuit 124 is connected to the first to m-th page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to m-th page buffers PB1 to PBm included in the read/write circuit 123.

In a read operation or verify operation, the sensing circuit 125 may generate a reference current in response to an allow bit VRYBIT signal generated by the control logic 130. Further, the sensing circuit 125 may output a pass signal or fail signal to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device (e.g., a memory controller).

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the peripheral circuit 120 may program a plurality of memory cells to any state among a plurality of program states.

The control logic 130 may control the peripheral circuit 120 to perform a program verify operation on the plurality of memory cells for at least one program state among the plurality of program states. The control logic 130 may determine a start time of a program verify operation for a program state higher than a target program state among the at least one program state, based on a result of a program verify operation for the target program state. The control logic 130 may control the peripheral circuit 120 to start the program verify operation for the highly ranked program state from a program loop corresponding to the determined start time.

In an embodiment, the control logic 130 may include a bit line voltage controller 131 and a program verify controller 132.

The bit line voltage controller 131 may control the peripheral circuit 120 to precharge a plurality of bit lines connected to the plurality of memory cells. In an embodiment, the bit line voltage controller 131 may control the peripheral circuit 120 to perform an all bit-line (All BL) scheme for precharging all of the plurality of bit lines connected to the plurality of memory cells in the program verify operation for the target program state. In another embodiment, the bit line voltage controller 131 may control the peripheral circuit 120 to perform a selected bit-line (Sel BL) scheme for precharging selected bit lines among the plurality of bit lines connected to the plurality of memory cells in the program verify operation for the target program state. The selected bit lines may be bit lines connected to a memory cell determined as a program fail according to data stored in a sensing latch among memory cells to be programmed to the target program state.

The program verify controller 132 may compare a program verify voltage corresponding to the target program state among the at least one program state in the program verify operation for the target program state with threshold voltages of the plurality of memory cells. The program verify controller 132 may count a bit number having a predetermined logic value, based on the comparison result. The target program state may be a most highly ranked program state among the at least one program state. The target program state may be a program state in which a corresponding program verify voltage is highest in the at least one program state.

The program verify controller 132 may determine a start time of a program verify operation for a program state higher than the target program state among the plurality of program states, based on the counted bit number having the predetermined logic value. In an embodiment, the counted bit number may be a pass bit number or a fail bit number among the memory cells to be programmed to the target program state, according to the predetermined logic value. A number of memory cells having a threshold voltage lower than the program verify voltage corresponding to the target program state among the memory cells to be programmed to the target program state may be the pass bit number.

In an embodiment, when the predetermined logic value is 1, the counted bit number may represent the fail bit number. When the predetermined logic value is 0, the counted bit number may represent the pass bit number. In another embodiment, when the predetermined logic value is 0, the counted bit number may represent the fail bit number. When the predetermined logic value is 1, the counted bit number may represent the pass bit number.

For example, the program verify controller 132 may count a fail bit number as a number of memory cells determined as the program fail among the memory cells to be programmed to the target program state. The program verify controller 132 may determine a start time of the program verify operation for the highly ranked program state, based on a result obtained by comparing the fail bit number with a reference value. When the fail bit number is less than or equal to the reference value, the program verify controller 132 may determine a program loop next to a program loop being currently performed as the start time of the program verify operation for the highly ranked program state.

Figure 3:
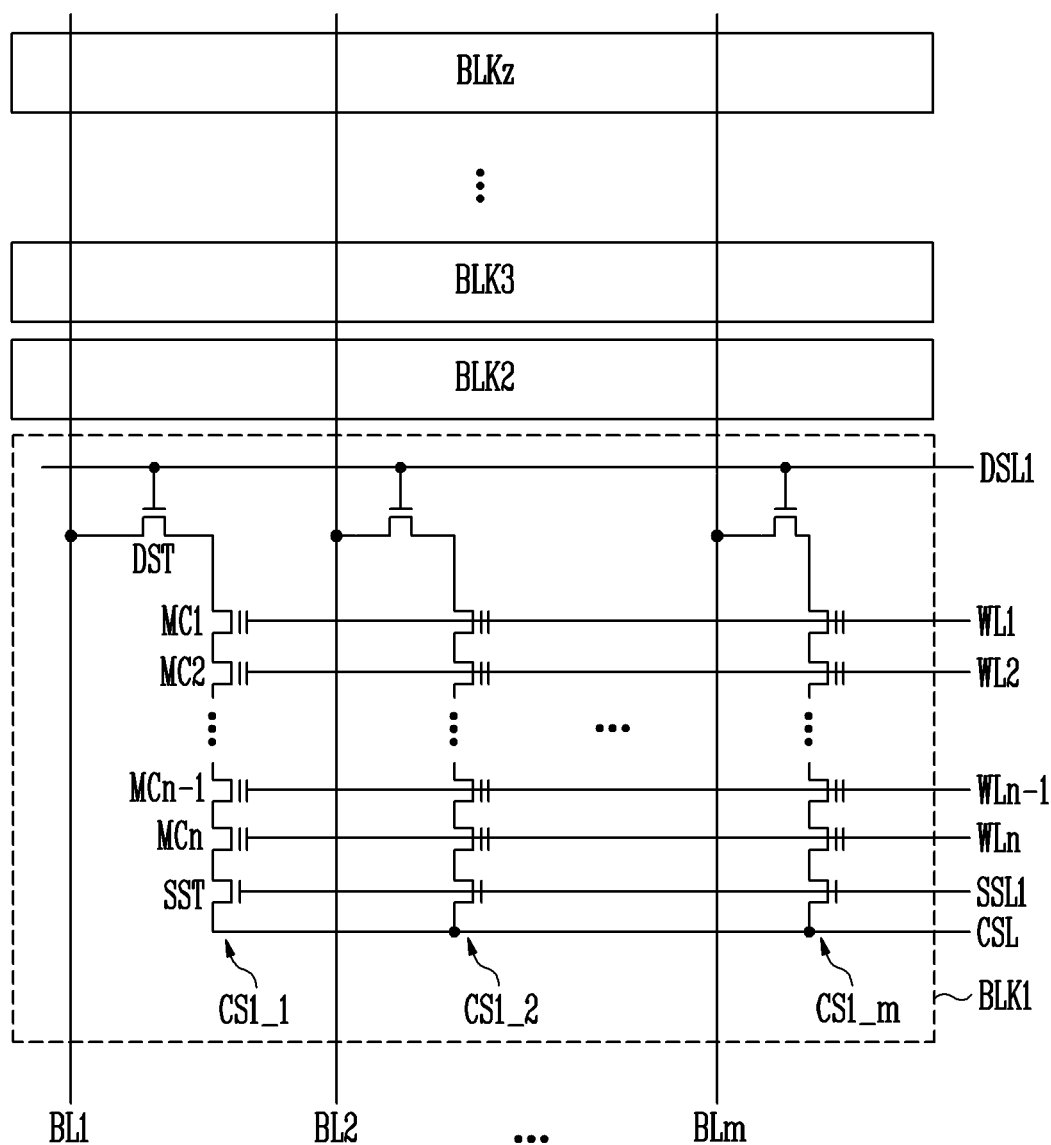
FIG. 3 is a diagram illustrating a memory cell array shown in FIG. 2, in accordance with an embodiment of the present disclosure.

FIG. 3 is a diagram illustrating the memory cell array 110 shown in FIG. 2, in accordance with an embodiment of the present disclosure.

Referring to FIG. 3, first to z-th memory blocks BLK1 to BLKz are commonly connected to the first to m-th bit lines BL1 to BLm. In FIG. 3, by way of example, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_m (where m is a positive integer). First to m-th cell strings CS1_1 to CS1_m are respectively connected to the first to m-th bit lines BL1 to BLm. Each of the first to m-th cell strings CS1_1 to CS1_m includes a drain select transistor DST, a plurality of memory cells MC1 to MCn (where n is a positive integer) connected in series, and a source select transistor SST.

A gate terminal of the drain select transistor DST included in each of the first to m-th cell strings CS1_1 to CS1_m is connected to a drain select line DSL1. Gate terminals of first to n-th memory cells MC1 to MCn included in each of the first to m-th cell strings CS1_1 to CS1_m are respectively connected to first to n-th word lines WL1 to WLn. A gate terminal of the source select transistor SST included in each of the first to m-th cell strings CS1_1 to CS1_m is connected to a source select line SSL1.

By way of example, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source electrode of the drain select transistor DST included in the first cell string CS1_1 is connected to a drain terminal of the first memory cell MC1 included in the first cell string CS1_1. The first to n-th memory cells MC1 to MCn are connected in series to each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. In an embodiment, the common source line CSL may be commonly connected to the first to z-th memory blocks BLK1 to BLKz.

The drain select line DSL1, the first to n-th word lines WL1 to WLn, and the source select line SSL1 are included in the row lines RL shown in FIG. 2. The drain select line DSL1, the first to n-th word lines WL1 to WLn, and the source select line SSL1 is controlled by the address decoder 121 shown in FIG. 2. The common source line CSL may be controlled by the control logic 130 shown in FIG. 2. The first to m-th bit lines BL1 to BLm are controlled by the read/write circuit 123 shown in FIG. 2.

Figure 4:
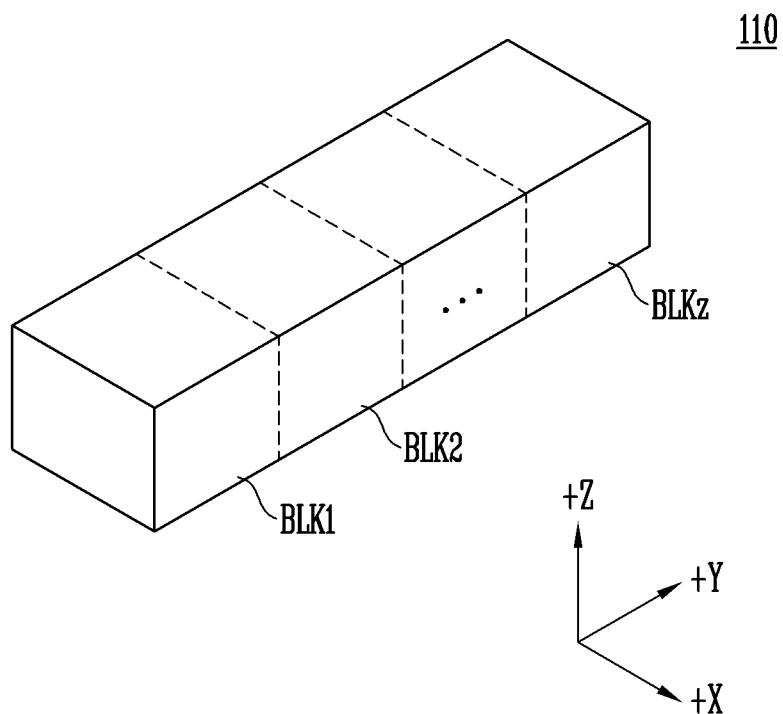
FIG. 4 is a diagram illustrating another example of the memory cell array shown in FIG. 2, in accordance with an embodiment of the present disclosure.

FIG. 4 is a diagram illustrating another example of the memory cell array 110 shown in FIG. 2 in accordance with an embodiment of the present disclosure.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
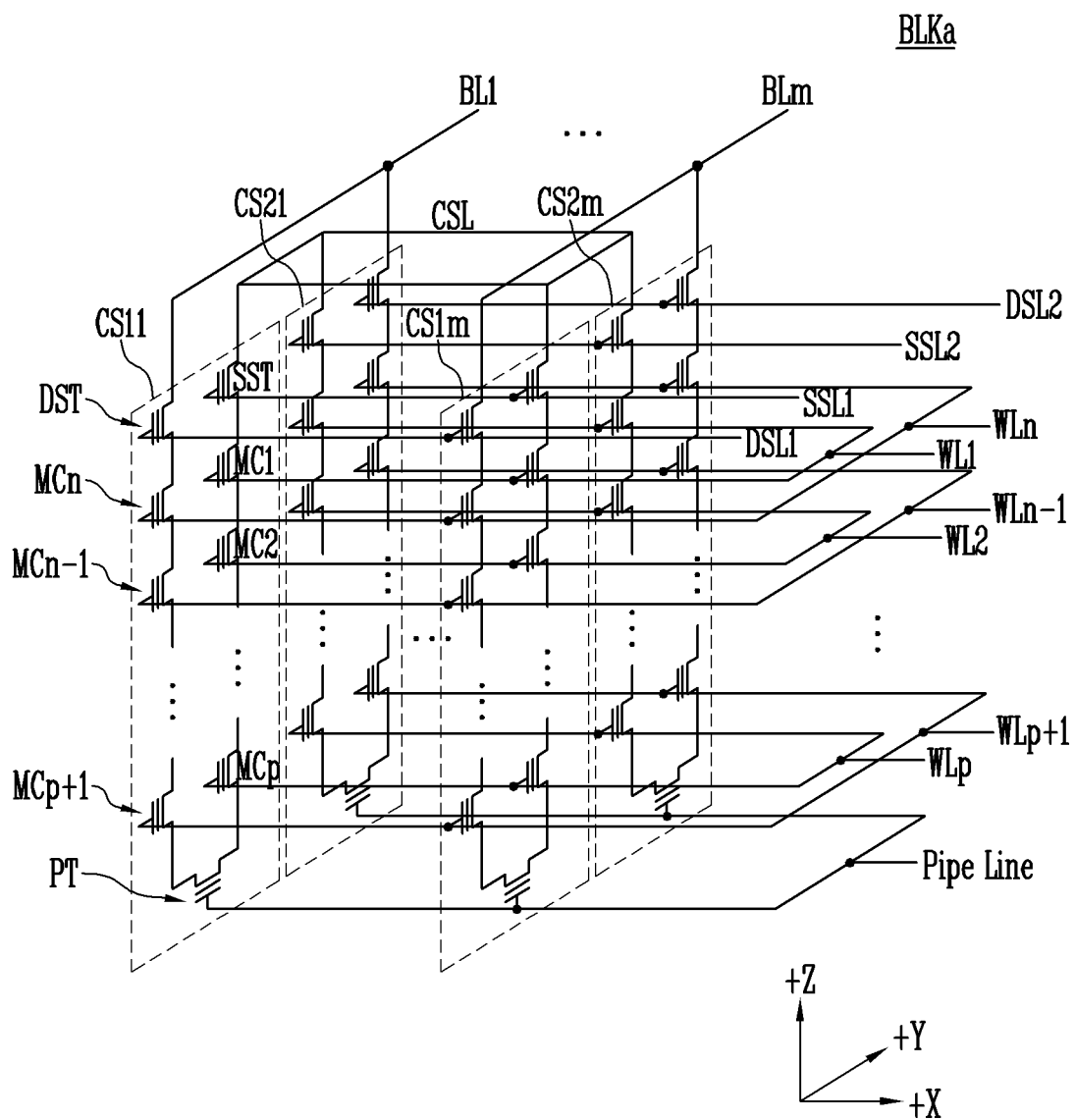
FIG. 5 is a circuit diagram illustrating a memory block among memory blocks shown in FIG. 4, in accordance with an embodiment of the present disclosure.

FIG. 5 is a circuit diagram illustrating a memory block BLKa among the memory blocks BLK1 to BLKz shown in FIG. 4, in accordance with an embodiment of the present disclosure.

Referring to FIG. 5, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). By way of example, FIG. 5 illustrates two cell strings arranged in a column direction (i.e., a +Y direction). However, it will be understood that three cell strings may be arranged in the column direction.

In an embodiment, one memory block may include a plurality of sub-blocks. One sub-block may include cell strings arranged in a 'U' shape on one column.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 5, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and a (p+1)-th to n-th memory cells MCp+1 to MCn. The first to p-th memory cells MC1 to MCp are sequentially arranged in the opposite direction of a +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 5, the cell strings CS11 and CS21 on a first column are connected to a first bit line BL1. The cell strings CS1m and CS2m on an m-th column are connected to an m-th bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. When one of the drain select lines DSL1 and DSL2 is selected, cell strings arranged in one row direction may be selected. When one of the word lines WL1 to WLn is selected, one page may be selected in the selected cell strings.

In another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to n-th memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells controls a voltage applied to the dummy word lines connected to the respective dummy memory cells, so that the dummy memory cells can have the required threshold voltage.

Figure 6:
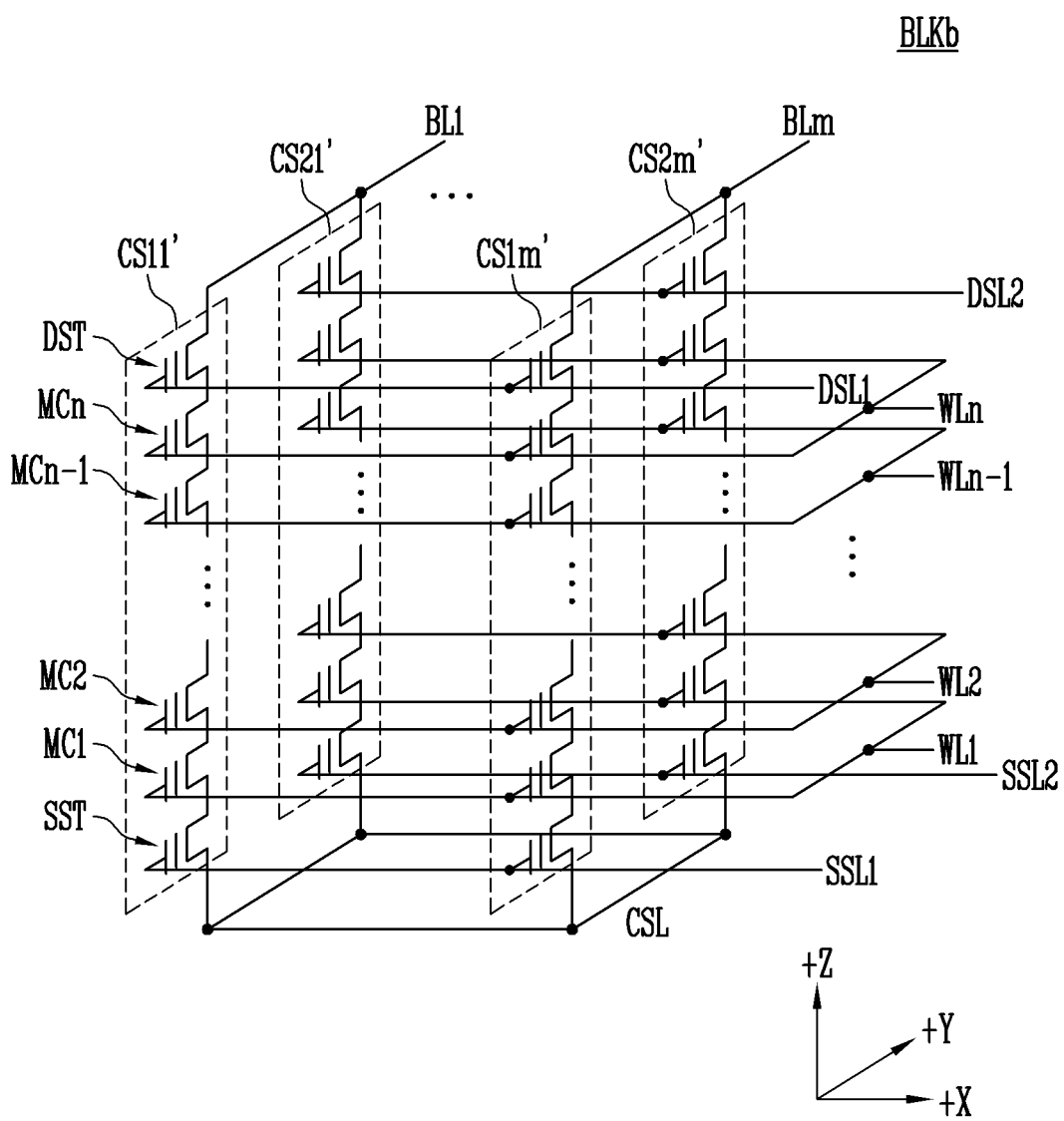
FIG. 6 is a circuit diagram illustrating another example of a memory block among the memory blocks shown in FIG. 4, in accordance with an embodiment of the present disclosure.

FIG. 6 is a circuit diagram illustrating another example BLKb of a memory block among the memory blocks BLK1 to BLKz shown in FIG. 4, in accordance with an embodiment of the present disclosure.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to n-th memory cells MC1 to MCn, and at least one drain select transistor DST, which are stacked on a substrate (not shown) under the memory block BLKb.

In an embodiment, one memory block may include a plurality of sub-blocks. One sub-block may include cell strings arranged in an 'I' shape on one column.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gate electrodes of the first to n-th memory cells MC1 to MCn are connected to first to n-th word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to n-th memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells controls a voltage applied to the dummy word lines connected to the respective dummy memory cells, so that the dummy memory cells can have the required threshold voltage.

Figure 7:
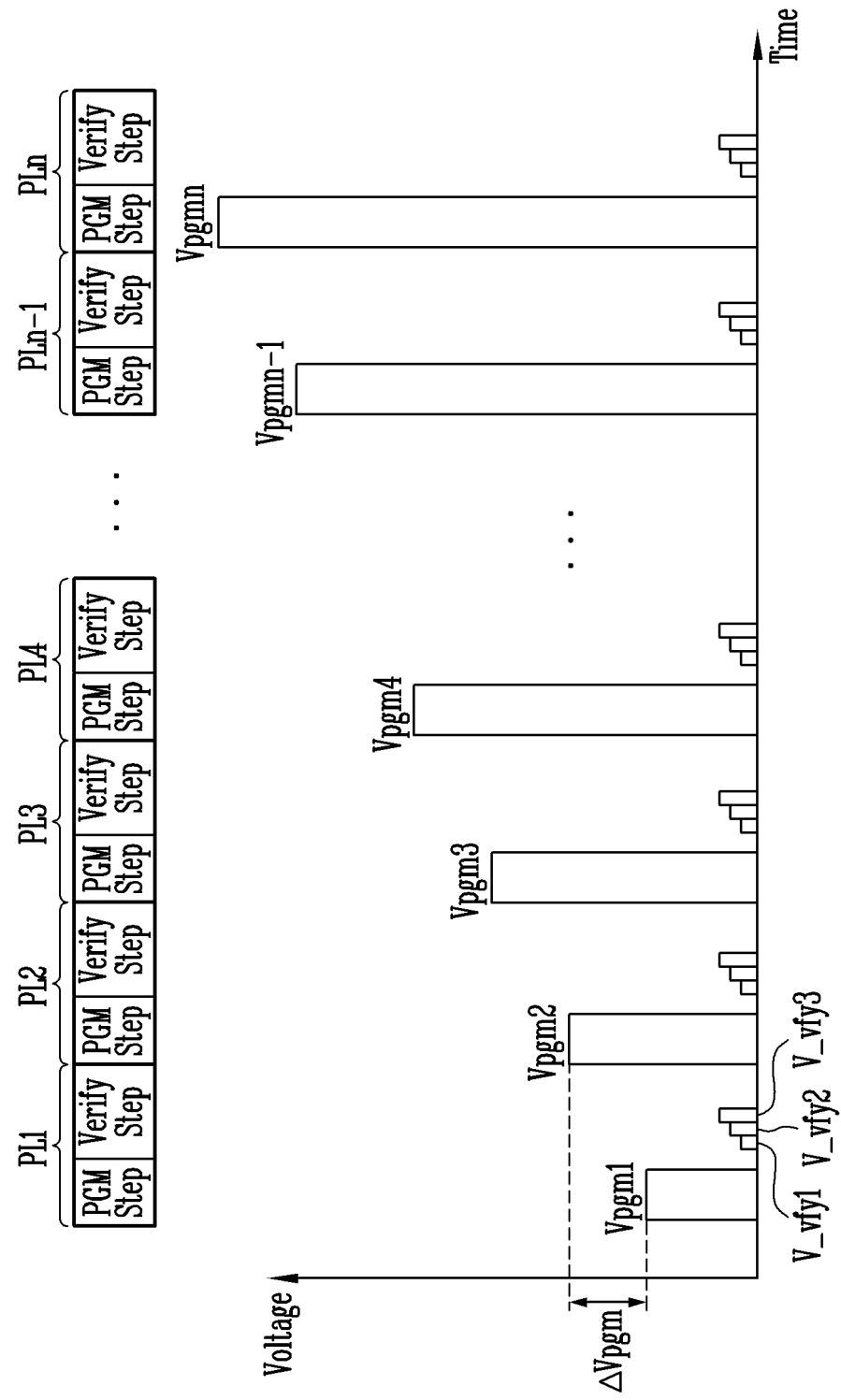
FIG. 7 is a diagram illustrating a program operation in accordance with an embodiment of the present disclosure.

FIG. 7 is a diagram illustrating a program operation in accordance with an embodiment of the present disclosure.

In FIG. 7, by way of example, a memory cell is a Multi-Level Cell (MLC) storing 2-bit data. However, the scope of the present disclosure is not limited thereto, and the memory cell may be a Triple Level Cell (TLC) storing 3-bit data or a Quad Level Cell (QLC) storing 4-bit data. The number of data bits stored by the memory cell may be one or more.

The memory device may program selected memory cells to have a threshold voltage corresponding to any state among a plurality of program states P1, P2, and P3 by performing a plurality of program loops PL1 to PLn.

Each of the plurality of program loops PL1 to PLn may include a program voltage apply step PGM Step of applying a program voltage to a selected word line connected to the selected memory cells and a program verify step Verify Step of determining whether memory cells have been programmed by applying verify voltages.

For example, when a first program loop PL1 is performed, first to third verify voltages V_vfy1 to V_vfy3 are sequentially applied to verify a program state of the selected memory cells after a first program voltage Vpgm1 is applied. Memory cells of which a target program state is a first program state P1 may be verified by the first verify voltage V_vfy1, memory cells of which a target program state is a second program state P2 may be verified by the second verify voltage V_vfy2, and memory cells of which a target program state is a third program state P3 may be verified by the third verify voltage V_vfy3.

In another embodiment, the third to first verify voltages V_vfy3 to V_vfy1 may be sequentially applied to verify the program state of the selected memory cells. That is, a verify voltage may be applied to the word line connected to the selected memory cells in a sequence from a high voltage to a low voltage.

It may be determined that the memory cells verify-passed by each of the verify voltages V_vfy1 to V_vfy3 have the target program state. Then, the memory cells may be program-inhibited in a second program loop PL2. In other words, a program inhibit voltage may be applied to a bit line connected to a verify-passed memory cell from the second program loop PL2.

A second program voltage Vpgm2 higher by a unit voltage ΔVpgm than the first program voltage Vpgm1 is applied to the selected word line to program the other memory cells except the program-inhibited memory cells in the second program loop PL2. Subsequently, a verify operation is performed identically to that of the first program loop PL1. In some embodiments, verify pass indicates that a memory cell is read as an off-cell by a corresponding verify voltage.

As described above, when the memory device programs a Multi-Level Cell (MLC) storing two bits, the memory device may verify memory cells having various program states as target program states by respectively using the first to third verify voltages V_vfy1 to V_vfy3.

In a verify operation, a verify voltage is applied to a selected word line as a word line to which selected memory cells are connected, and the page buffer shown in FIG. 2 may determine whether memory cells have been verify-passed, based on a current flowing through or a voltage applied to bit lines respectively connected to the selected memory cells.

Figure 8:
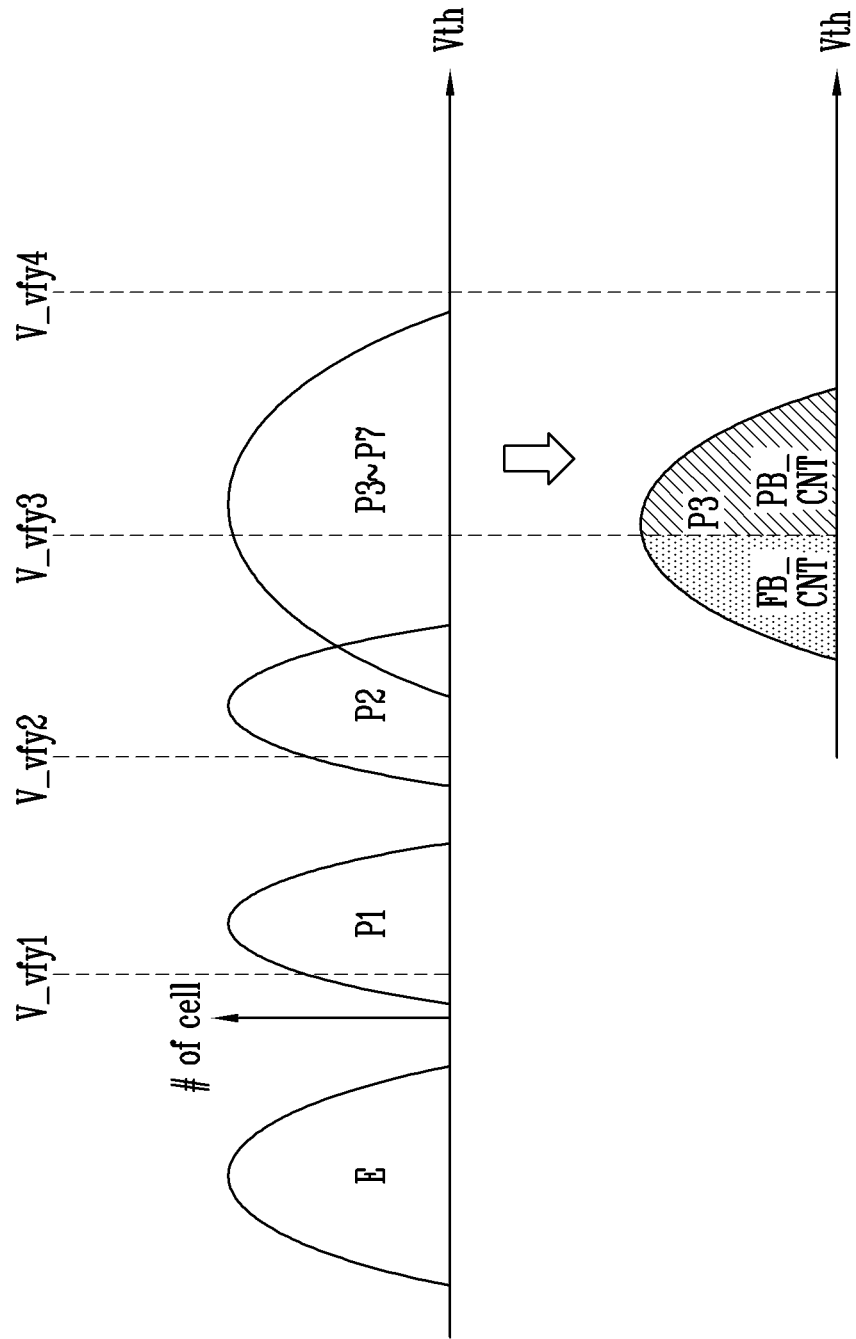
FIG. 8 is a diagram illustrating counting a bit number having a predetermined logic value in a program verify operation for a target program state in accordance with an embodiment of the present disclosure.

FIG. 8 is a diagram illustrating counting a bit number having a predetermined logic value in a program verify operation for a target program state in accordance with an embodiment of the present disclosure.

Referring to FIG. 8, a memory cell may be a Triple Level Cell (TLC) storing 3 data bits. The number of data bits stored by the memory cell is not limited to this embodiment.

A plurality of memory cells may be programmed to any program state among a plurality of program states P1 to P7. During a program operation, a threshold voltage distribution of the memory cells may be formed sequentially from a first program state P1 to a seventh program state P7.

In FIG. 8, a program verify operation using program verify voltages V_vfy1 to V_vfy3 respectively corresponding to the first to third program states P1 to P3 may be performed on the plurality of memory cells. The third program state P3 which is the most highly ranked program state among the first to third program states P1 to P3 in which the program verify operation is performed, may be a target program state. A start time of a program verify operation for the fourth program state P4 which is the program state higher than the target program state may be determined based on a result of the program verify operation for the target program state.

The number of memory cells having a threshold voltage lower than the verify voltage V_vfy3 corresponding to the third program state P3 among memory cells to be programmed to the third program state P3 may have a fail bit count FB_CNT. The number of memory cells having a threshold voltage higher than or equal to the verify voltage V_vfy3 corresponding to the third program state P3 among the memory cells to be programmed to the third program state P3 may have a pass bit count PB_CNT.

In an embodiment, the fail bit count FB_CNT may be a bit number having a predetermined logic value (e.g., 1) among the memory cells to be programmed to the third program state P3. The pass bit count PB_CNT may be a bit number having the predetermined logic value (e.g., 0) among the memory cells to be programmed to the third program state P3. In another embodiment, the fail bit count FB_CNT may be a bit number having the predetermined logic value (e.g., 0) among the memory cells to be programmed to the third program state P3. The pass bit count PB_CNT may be a bit number having the predetermined logic value (e.g., 1) among the memory cells to be programmed to the third program state P3.

In an embodiment, when the fail bit count FB_CNT is less than or equal to a fail reference value, a program loop next to a program loop being currently performed may be determined as the start time of the program verify operation for the fourth program state P4. In an embodiment, when the pass bit count PB_CNT is greater than or equal to a pass reference value, the program loop next to the program loop being currently performed may be determined as the start time of the program verify operation for the fourth program state P4.

Figure 9:
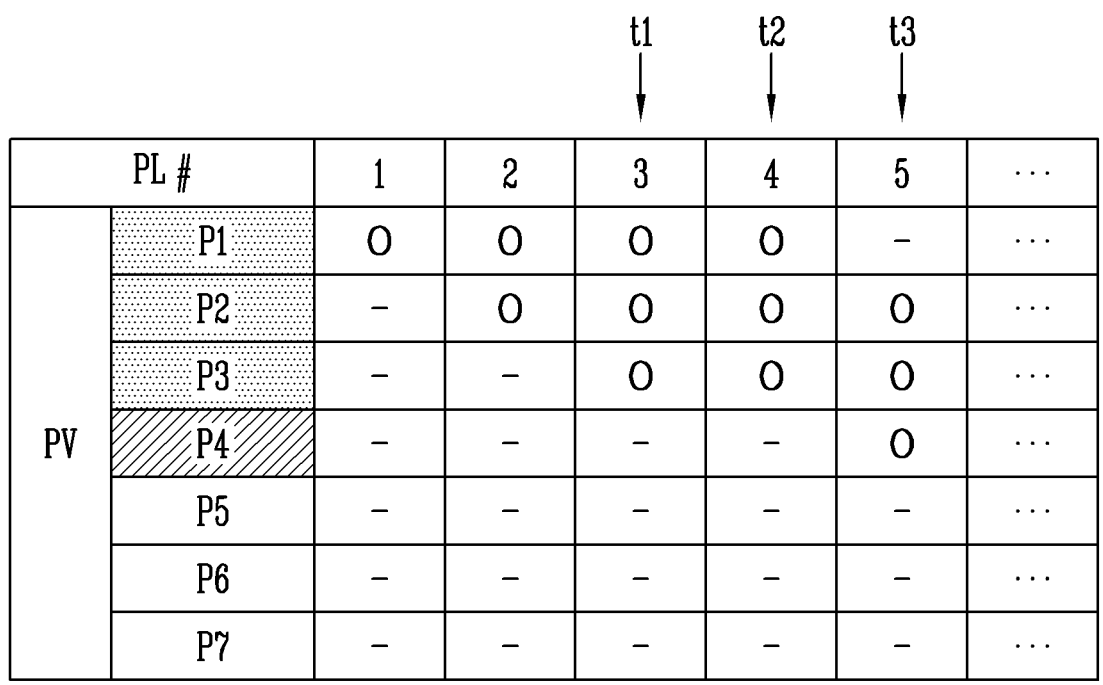
FIG. 9 is a diagram illustrating a start time of a program verify operation for a program state higher than the target program state in accordance with an embodiment of the present disclosure.

FIG. 9 is a diagram illustrating a start time of a program verify operation for a program state higher than the target program state in accordance with an embodiment of the present disclosure.

Referring to FIG. 9, a program verify operation for the first to third program states P1 to P3 may be performed at t1. The third program state P3 which is the most highly ranked program state among the first to third program states P1 to P3 for which the program verify operation is performed at t1, may be the target program state.

A start time of a program verify operation for the fourth program state P4 which is the program state higher than the third program state P3 may be determined based on a result of the program verify operation for the third program state P3. In this embodiment, the program state higher than the third program state P3 as the target program state is not limitedly construed to be the fourth program state P4. The program state higher than the third program state P3 may be construed to be any program state among the fourth to seventh program states P4 to P7.

At t1, when a bit number having a predetermined logic value is the fail bit number, the bit number having the predetermined logic value, which is counted in the program verify operation for the third program state P3, may be greater than the fail reference value. Alternatively, when the bit number having the predetermined logic value is the pass bit number, the bit number having the predetermined logic value, which is counted in the program verify operation for the third program state P3, may be less than the pass reference value.

Therefore, the start time of the program verify operation for the fourth program state P4 may be determined after a program loop PL4 next to a program loop PL3 being performed at t1.

At t2, when the bit number having the predetermined logic value is the fail bit number, the bit number having the predetermined logic value, which is counted in the program verify operation for the third program state P3, may be less than or equal to the fail reference value. Alternatively, when the bit number having the predetermined logic value is the pass bit number, the bit number having the predetermined logic value, which is counted in the program verify operation for the third program state P3, may be greater than or equal to the pass reference value.

Therefore, the start time of the program verify operation for the fourth program state P4 may be determined as a program loop PL5 next to the program loop PL4 being performed at t2.

A program verify operation for the second to fourth program states P2 to P4 may be performed at t3. The fourth program state P4 which is the most highly ranked program state among the second to fourth program states P2 to P4 for which the program verify operation is performed at t3 may be the target program state.

In a similar manner, a start time of a program verify operation for the fifth program state P5 which is the program state higher than the fourth program state P4 may be determined based on a result of the program verify operation for the fourth program state P4.

In accordance with the embodiment of the present disclosure, a program operation for a program state higher than the target program state may be started at an appropriate time, based on a result of the program verify operation for the target program state among at least one program state for which a current program verify operation is performed. Thus, a program verify operation for a highly ranked program state may be prevented from being performed at an unnecessarily early or late time, and a total program verify operation time may be reduced.

Figure 10:
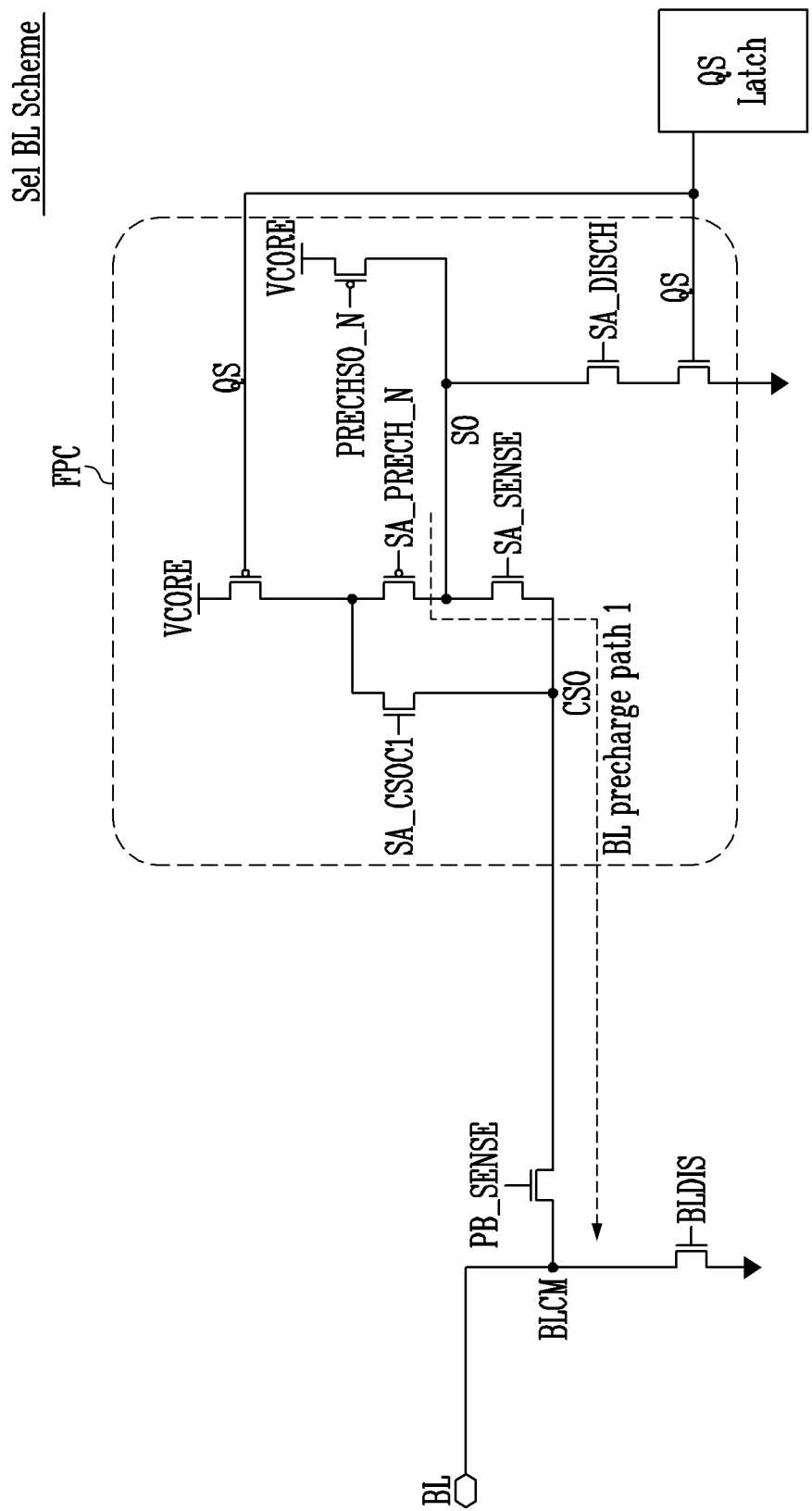
FIG. 10 is a diagram illustrating a page buffer shown in FIG. 2 in accordance with an embodiment of the present disclosure.

FIG. 10 is a diagram illustrating a page buffer shown in FIG. 2 in accordance with an embodiment of the present disclosure.

Referring to FIG. 10, the page buffer may be connected to a memory cell through a bit line BL.

The page buffer may include a first precharge circuit FPC and a sensing latch QS Latch. The configuration of an electrical circuit included in the page buffer is not limited to this embodiment.

In the program verify operation for the target program state, the page buffer may precharge a bit line BL connected to a memory cell determined as a program fail according to data QS stored in the sensing latch QS Latch among the memory cells to be programmed to the target program state.

The sensing latch QS Latch may store data obtained by sensing a potential of the bit line BL connected to the memory cell through a sensing node SO. The first precharge circuit FPC may precharge the bit line BL according to a first precharge signal SA_CSOC1 and the data QS in the program verify operation.

In an embodiment, selected bit lines among a plurality of bit lines connected to a plurality of page buffers may be precharged according to the Sel BL scheme in the program verify operation for the target program state. The selected bit lines may be bit lines connected to memory cells determined as the program fail according to the data QS among the memory cells to be programmed to the target program state.

A bit line discharge signal BLDIS having a high level is applied before the bit line BL is precharged, and therefore, the potential of the bit line BL may be initialized to a ground voltage level. Subsequently, the bit line discharge signal BLDIS having a low level and a page buffer control signal PB_SENSE having the high level may be applied when the bit line BL is precharged.

The first precharge signal SA_CSOC1 having the high level may be applied in the program verify operation. When the data QS has the low level, the bit line BL may be precharged to the high level. When the data QS has the high level, the bit line BL may be discharged to the low level.

A program verify voltage corresponding to the target program state may be applied to a word line connected to the memory cells after the bit line BL is precharged. When the program verify voltage corresponding to the target program state is applied to the word line, a fail bit number which is the number of memory cells determined as the program fail among the memory cells to be programmed to the target program state may be counted by sensing a potential or current of the bit line BL, which is changed according to a threshold voltage of the memory cell. The fail bit number may be a bit number having a predetermined logic value among data sensed from the memory cells to be programmed to the target program state.

On the contrary, a pass bit number which is the number of memory cells determined as a program pass among the memory cells to be programmed to the target program state may be counted by sensing the potential of the bit line BL, which is changed according to the threshold voltage of the memory cell. The pass bit number may be a bit number having a value obtained by inverting the predetermined logic value among the data sensed from the memory cells to be programmed to the target program state.

Figure 11:
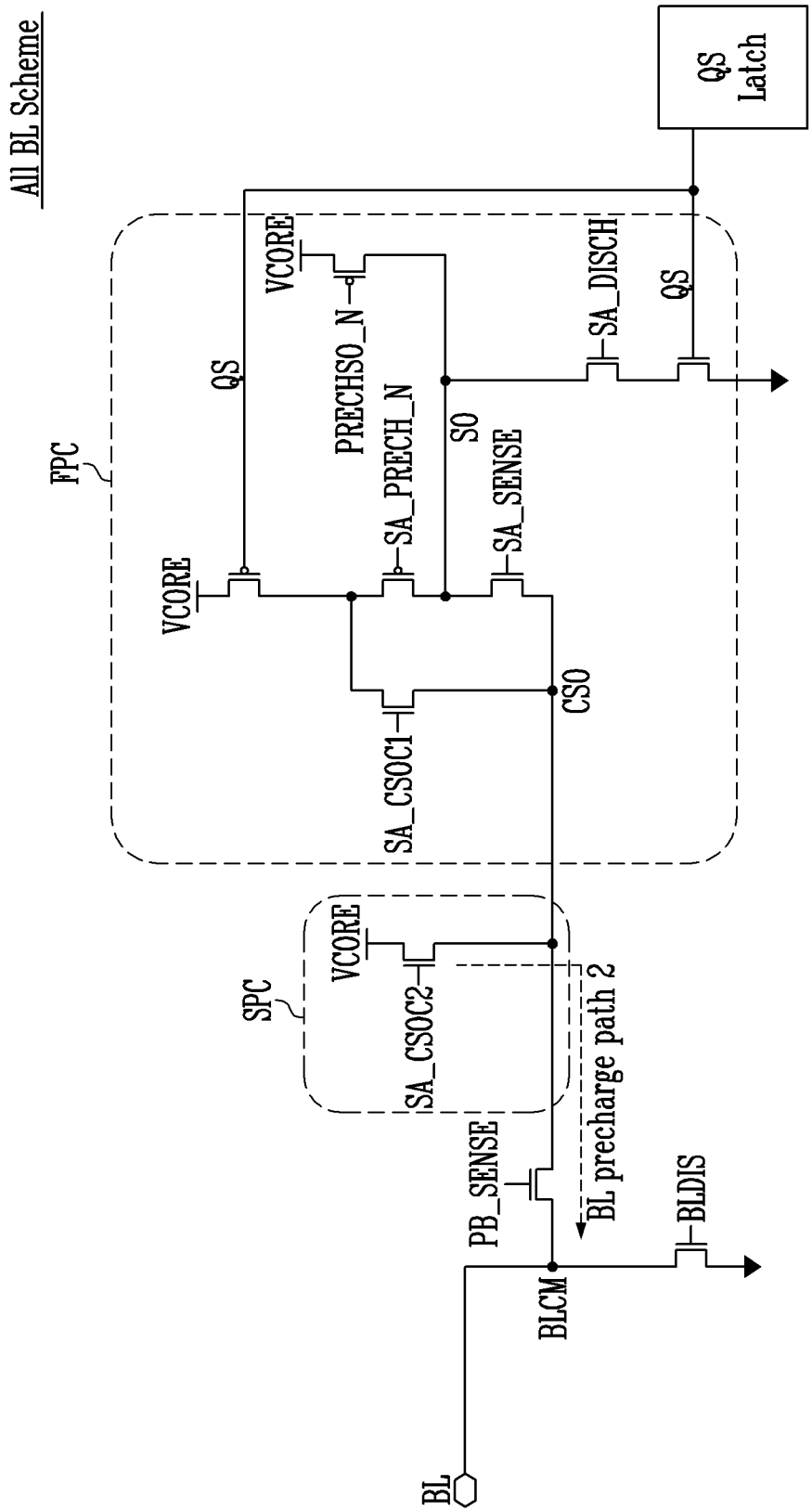
FIG. 11 is a diagram illustrating a page buffer shown in FIG. 2 in accordance with an embodiment of the present disclosure.

FIG. 11 is a diagram illustrating a page buffer shown in FIG. 2 in accordance with an embodiment of the present disclosure.

Referring to FIG. 11, as compared with the page buffer shown in FIG. 10, the page buffer may further include a second precharge circuit SPC. The second precharge circuit SPC may precharge the bit line according to a second precharge signal SA_CSOC2 in the program verify operation.

In an embodiment, all of the plurality of bit lines connected to the plurality of page buffers may be precharged according to the All BL scheme in the program verify operation for the target program state. The plurality of bit lines may be precharged through the second precharge circuit SPC, regardless of the data QS stored in the sensing latch QS Latch.

The bit line discharge signal BLDIS having the high level is applied before the bit line BL is precharged, and therefore, the potential of the bit line BL may be initialized to the ground voltage level. The bit line discharge signal BLDIS having the low level and the page buffer control signal PB_SENSE having the high level may be applied when the bit line BL is precharged.

The second precharge signal SA_CSOC2 having the high level may be applied in the program verify operation, and the bit line BL may be precharged to the high level.

The program verify voltage corresponding to the target program state may be applied to the word line connected to the memory cells after the bit line BL is precharged. When the program verify voltage corresponding to the target program state is applied to the word line, a fail bit number which is the number of memory cells determined as the program fail among the memory cells to be programmed to the target program state may be counted by sensing a potential or current of the bit line BL changed according to the threshold voltage of the memory cell. The fail bit number may be a bit number having a predetermined logic value among data sensed from the memory cells to be programmed to the target program state.

On the contrary, a pass bit number which is the number of memory cells determined as a program pass among the memory cells to be programmed to the target program state may be counted by sensing the potential of the bit line BL, which is changed according to the threshold voltage of the memory cell. The pass bit number may be a bit number having a value obtained by inverting the predetermined logic value among the data sensed from the memory cells to be programmed to the target program state.

Figure 12:
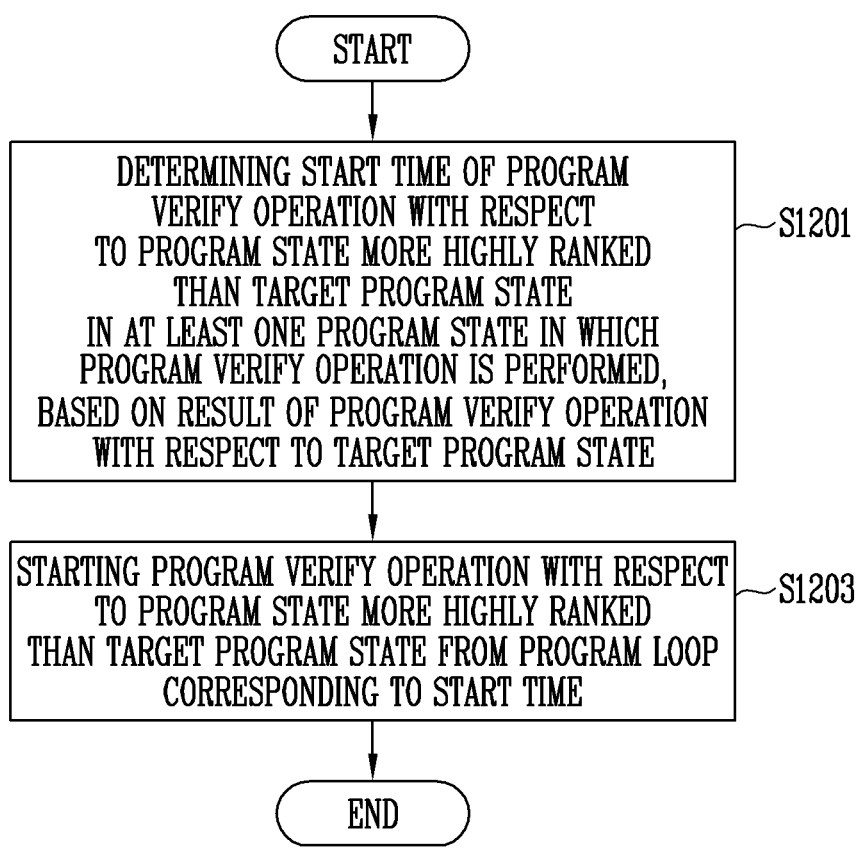
FIG. 12 is a flowchart illustrating an operation of the memory device in accordance with an embodiment of the present disclosure.

FIG. 12 is a flowchart illustrating an operation of the memory device in accordance with an embodiment of the present disclosure.

Referring to FIG. 12, in operation S1201, the memory device may determine a start time of a program verify operation for a program state higher than a target program state among at least one program state in which a program verify operation is performed, based on a result of a program verify operation for the target program state.

In operation S1203, the memory device may start the program verify operation for the program state higher than the target program state from a program loop corresponding to the start time.

Figure 13:
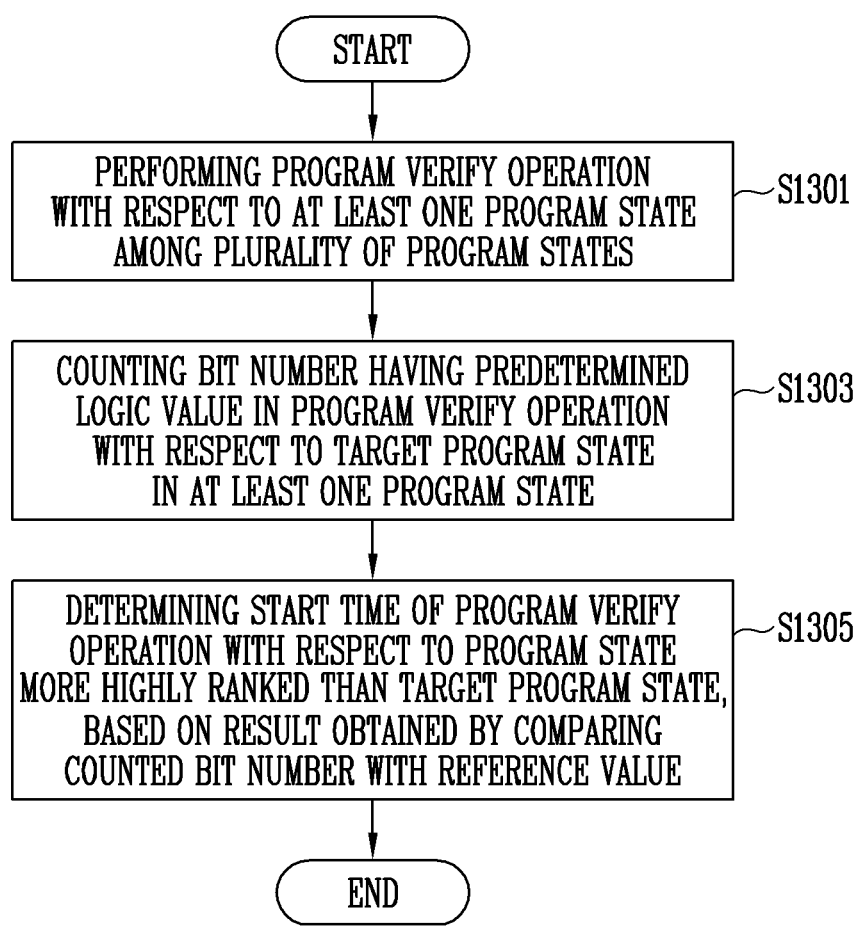
FIG. 13 is a flowchart illustrating an operation of determining a start time of a program verify operation for a program state higher than a target program state of the memory device in accordance with an embodiment of the present disclosure.

FIG. 13 is a flowchart illustrating an operation of determining a start time of a program verify operation for a program state higher than a target program state of the memory device in accordance with an embodiment of the present disclosure.

Referring to FIG. 13, in operation S1301, the memory device may perform a program verify operation for at least one program state among a plurality of program states.

In operation S1303, the memory device may count a bit number having a predetermined logic value in a program verify operation for a target program state among the at least one program state.

In operation S1305, the memory device may determine a start time of a program verify operation for a program state higher than the target program state, based on a result obtained by comparing the counted bit number with a reference value.

Figure 14:
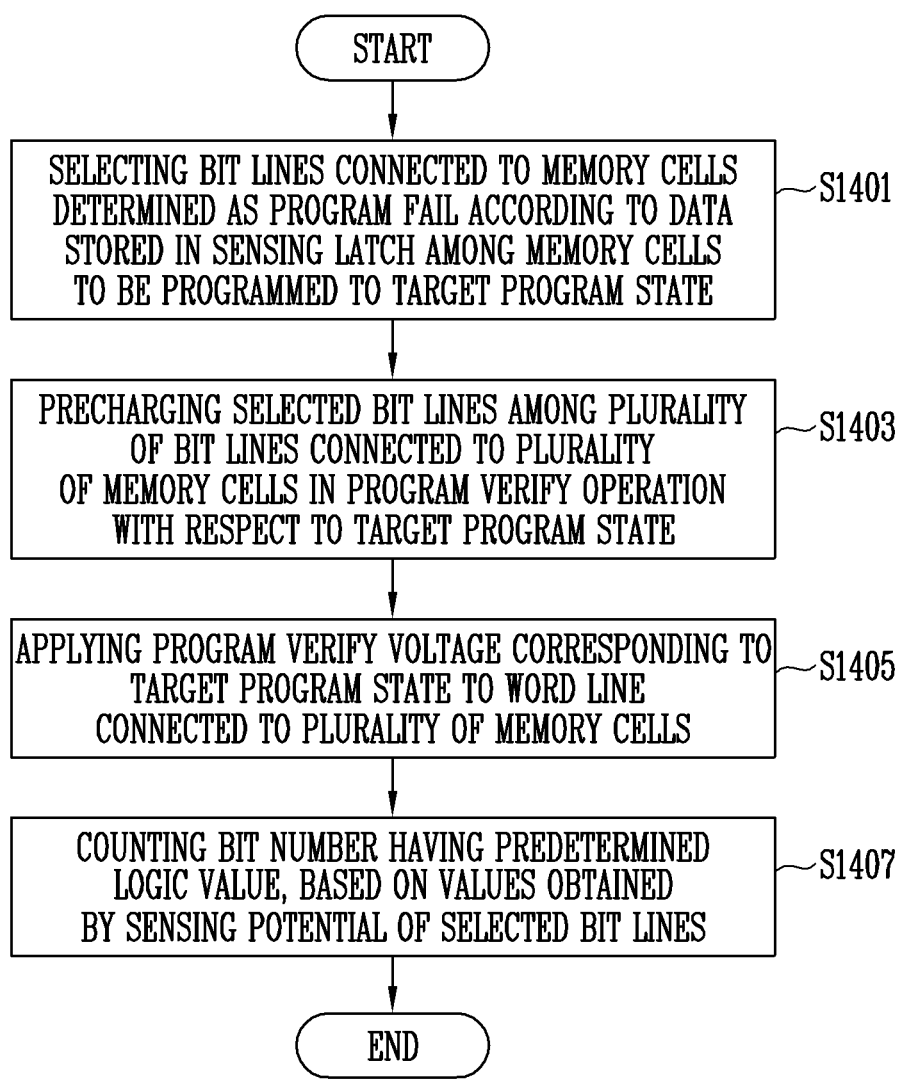
FIG. 14 is a flowchart illustrating a program verify operation of the memory device in accordance with an embodiment of the present disclosure.

FIG. 14 is a flowchart illustrating a program verify operation of the memory device in accordance with an embodiment of the present disclosure.

Referring to FIG. 14, in operation S1401, the memory device may select bit lines connected to memory cells determined as a program fail according to data stored in the sensing latch among memory cells to be programmed to a target program state.

In operation S1403, the memory device may precharge the selected bit lines among a plurality of bit lines connected to a plurality of memory cells in a program verify operation for the target program state.

In operation S1405, the memory device may apply a program verify voltage corresponding to the target program state to a word line connected to the plurality of memory cells.

In operation S1407, the memory device may count a bit number having a predetermined logic value, based on values obtained by sensing a potential of the selected bit lines.

FIG. 15 is a flowchart illustrating a program verify operation of the memory device in accordance with an embodiment of the present disclosure.

Referring to FIG. 15, in operation S1501, the memory device may precharge all of a plurality of bit lines connected to a plurality of memory cells in a program verify operation for a target program state.

In operation S1503, the memory device may apply a program verify voltage corresponding to the target program state to a word line connected to the plurality of memory cells.

In operation S1505, the memory device may count a bit number having a predetermined logic value, based on values obtained by sensing a potential of the plurality of bit lines.

In accordance with the present disclosure, a memory device is provided which has improved program operation performance and an operating method of the memory device.

The methods, processes, and/or operations described herein may be performed by code or instructions to be executed by a computer, processor, controller, or other signal processing device.

When implemented in at least partially in software, the controllers, processors, managers, devices, modules, units, multiplexers, generators, logic, interfaces, decoders, drivers and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Furthermore, various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. A memory device comprising:
    a plurality of memory cells;
    a peripheral circuit configured to program the plurality of memory cells to a program state among a plurality of program states; and
    a control logic configured to control the peripheral circuit to perform a program verify operation for at least one program state among the plurality of program states, count a bit number having a predetermined logic value by comparing a program verify voltage corresponding to a target program state among the at least one program state in a program verify operation for the target program state with threshold voltages of the plurality of memory cells, and determine a start time of a program verify operation for a program state higher than the target program state among the plurality of program states, based on comparison between the bit number having the predetermined logic value and a reference value,
    wherein determination of the start time of the program verify operation for the program state higher than the target program state is performed whenever the target program state changes.

2. The memory device of claim 1, wherein the target program state is a highest program state among program states in which a program operation has been performed.

3. The memory device of claim 1, wherein the control logic includes:
    a bit line voltage controller configured to control the peripheral circuit to precharge a plurality of bit lines connected to the plurality of memory cells; and
    a program verify controller configured to determine the start time, based on a result obtained by comparing the bit number having the predetermined logic value with the reference value.

4. The memory device of claim 3, wherein the program verify controller controls the peripheral circuit to start the program verify operation for the program state higher than the target program state from a program loop corresponding to the start time.

5. The memory device of claim 3, wherein the program verify controller counts a fail bit number which is a number of memory cells determined as a program fail among memory cells to be programmed to the target program state, based on the bit number having the predetermined logic value, in the program verify operation for the target program state, and determines the start time of the program verify operation for the program state higher than the target program state, based on a result obtained by comparing the fail bit number with the reference value.

6. The memory device of claim 5, wherein, when the fail bit number is less than or equal to the reference value, the program verify controller controls the peripheral circuit to perform the program verify operation for the program state higher than the target program state from a program loop next to a current program loop being performed.

7. The memory device of claim 3, wherein the peripheral circuit includes a plurality of page buffers connected to the plurality of memory cells through the plurality of bit lines, and
    wherein each of the plurality of page buffers includes:
    a sensing latch configured to store data obtained by sensing a potential of a bit line connected to a memory cell through a sensing node; and
    a first precharge circuit configured to precharge the bit line connected to the memory cell according to a first precharge signal and previous data stored in the sensing latch.

8. The memory device of claim 7, wherein the bit line voltage controller controls the first precharge circuit to precharge selected bit lines among the plurality of bit lines in the program verify operation for the target program state, and wherein the selected bit lines are bit lines connected to memory cells determined as a program fail according to the previous data stored in the sensing latch among memory cells to be programmed to the target program state.

9. The memory device of claim 7, wherein each of the plurality of page buffers further includes a second precharge circuit configured to precharge the bit line connected to the memory cell according to a second precharge signal.

10. The memory device of claim 9, wherein the bit line voltage controller controls the second precharge circuit to precharge all of the plurality of bit lines in the program verify operation for the target program state.

11. A method for operating a memory device including a plurality of memory cells, the method comprising:

performing a program verify operation for at least one program state among a plurality of program states;

counting a bit number having a predetermined logic value by comparing a program verify voltage corresponding to a target program state among the at least one program state in a program verify operation for the target program state with threshold voltages of the plurality of memory cells; and determining a start time of a program verify operation for a program state higher than the target program state among the plurality of program states, based on the bit number having the predetermined logic value with a reference value whenever the target program state changes.

12. The method of claim 11, further comprising starting the program verify operation for the program state higher than the target program state from a program loop corresponding to the start time.

13. The method of claim 11, wherein the target program state is a highest program state among program states in which a program operation has been performed.

14. The method of claim 11, wherein the determining of the start time of the program verify operation for the program state higher than the target program state includes:

counting a fail bit number which is a number of memory cells determined as a program fail among memory cells to be programmed to the target program state, based on the bit number having the predetermined logic value; and determining the start time of the program verify operation for the program state higher than the target program state, based on a result obtained by comparing the fail bit number with the reference value.

15. The method of claim 14, wherein, when the fail bit number is less than or equal to the reference value, a program loop next to a current program loop being performed is determined as the start time of the program verify operation for the program state higher than the target program state.

16. The method of claim 11, wherein the performing of the program verify operation for the target program state among the at least one program state includes:

precharging all of a plurality of bit lines connected to the plurality of memory cells; and applying the program verify voltage corresponding to the target program state to a word line connected to the plurality of memory cells.

17. The method of claim 16, wherein the counting of the bit number having the predetermined logic value includes counting, as the bit number having the predetermined logic value, a number of memory cells having a threshold voltage less than the program verify voltage corresponding to the target program state among the plurality of memory cells.

18. The method of claim 11, wherein the performing of the program verify operation for the target program state among the at least one program state includes:

selecting bit lines connected to memory cells determined as a program fail according to previous data stored in a sensing latch among memory cells to be programmed to the target program state;

precharging the selected bit lines among a plurality of bit lines connected to the plurality of memory cells; and applying the program verify voltage corresponding to the target program state to a word line connected to the plurality of memory cells.

19. The method of claim 18, wherein the counting of the bit number having the predetermined logic value includes counting, as the bit number having the predetermined logic value, a number of memory cells having a threshold voltage less than the program verify voltage corresponding to the target program state among the memory cells to be programmed to the target program state.

20. A memory device comprising:

a plurality of memory cells;

a peripheral circuit coupled to the plurality of memory cells; and a control logic coupled to the peripheral circuit and configured to control the peripheral circuit to:

program the plurality of memory cells to a target program state among a plurality of program states;

perform a program verify operation for the target program state on the plurality of memory cells to verify whether the plurality of memory cells has the target program state;

determine a start time of a program verify operation for an adjacent program state to the target program state based on a number of memory cells associated with a pass or fail of the program verify operation for the target program state; and perform the program verify operation for the adjacent program state on the plurality of memory cells at the determined start time, wherein determination of the start time of the program verify operation for the adjacent program state is performed whenever the target program state changes.

* * * * *